United States Patent [19]

Edwards et al.

[11] Patent Number: 4,514,624
[45] Date of Patent: Apr. 30, 1985

[54] PHOTON DRAG DETECTORS

[75] Inventors: Julian G. Edwards, Weybridge; Alan G. Roddie, Isleworth, both of England

[73] Assignee: The Secretary of State for Industry in Her Britannic Majesty's Government of the United Kingdom of Great Britain and Northern Ireland, London, England

[21] Appl. No.: 408,897

[22] Filed: Aug. 17, 1982

[30] Foreign Application Priority Data

Aug. 19, 1981 [GB] United Kingdom ............... 8125376

[51] Int. Cl.³ ........................................... H01J 40/14
[52] U.S. Cl. ............................................... 250/211 R
[58] Field of Search ............... 250/211 R, 212, 338, 250/370, 371; 350/356, 355; 356/215

[56] References Cited

U.S. PATENT DOCUMENTS

| | | | |
|---|---|---|---|
| 3,493,752 | 2/1970 | Jund et al. | 250/211 R |
| 3,527,944 | 9/1970 | Kraner | 250/370 |
| 3,718,820 | 2/1973 | Jacobs | 250/211 R |
| 4,254,332 | 3/1981 | Mashburn et al. | 250/211 R |
| 4,264,375 | 4/1981 | Silvast et al. | 250/212 |

OTHER PUBLICATIONS

Danishevskii et al., Soviet Physics JETP, vol. 31, No. 2, Aug. 1970, "Dragging of Free Carriers . . ."pp. 292 to 295.
Gibson, A. F. et al., Applied Physics Letters, vol. 17, No. 2, 15th Jul. 1970, "Photon Drag in Germanium", pp. 75 to 77.
Gibson, A. F. et al., Jnl. of Physics C, 1971, vol. 4, pp. 2209 to 2219, "SigSign Reversal of the Photon Drag Effect in p Type Germanium".

Primary Examiner—David C. Nelms
Assistant Examiner—Jere J. Brophy
Attorney, Agent, or Firm—Cushman, Darby & Cushman

[57] ABSTRACT

A photon drag detector having a block of semi-conductor material with two opposite faces through one of which a beam of radiation can enter and from the other of which it can emerge; spaced end electrodes in contact with said block, one adjacent to each of said opposite faces; at least two intermediate electrodes in contact with said block, arranged intermediate and spaced from said end electrodes and spaced from each other; and an impedance connecting said end electrodes; whereby the change in sensitivity of the detector with the position of the beam in the said block can be made small. The block of semi-conductor material is typically bar shaped with the opposite faces substantially parallel end faces of the bar. The bar is conveniently cylindrical. The electrodes are preferably ring electrodes, embracing the block and parallel with the planes of the opposite faces. The semi-conductor may be P-doped germanium of about 30 ohm centimeter resistivity, and the impedance may be a resistance in the range from about 100 to about 400 ohm.

12 Claims, 4 Drawing Figures

PHOTON DRAG DETECTORS

The invention relates to photon drag detectors. Such detectors are used to measure the power of laser beams, more especially in the infra red part of the spectrum, and have been described, for example, by Danishevski, Soviet Phys JETP 31 292-5, and by Gibson et al, Appl Phys Letters, 17, 75-7.

Such a detector comprises essentially a block of semi conductor material, typically germanium, through which a laser beam under investigation is allowed to pass. The beam photons tend to sweep carriers in the semi conductor to one end of the block. However, the electrons and holes which contitute the carriers are not acted upon equally by the beam and the result is that a small difference in voltage is set up across the block in the direction of the beam, the voltage typically being of the order of millivolts. The voltage is a measure of the power of the beam.

It has been found that the sensitivity of a detector, that is the voltage available for a given beam power, varies according to the position of the beam in the block of semi conductor material. Considering a cylindrical block, and the beam passing through it, parallel with the cylinder axis, in general the signal is a minimum when the beam is on the axis, rises by about 50% as the beam is made to lie closer to the surface of the cylinder and falls rapidly to zero as the beam begins to lie partly inside and partly outside the cylinder. It is not easy to pre-determine accurately where the beam lies in relation to the cylinder axis; consequently power measurements may be in error by a substantial amount.

The present invention provides means whereby error due to variation of the position of a beam over the cross section of a detector may be kept to a low level.

According to the invention a photon drag detector has a block of semi conductor material with two opposite faces through one of which a beam of radiation can enter and from the other of which it can emerge; spaced end electrodes in contact with said block, one adjacent to each of said opposite faces; at least two intermediate electrodes in contact with said block, arranged intermediate and spaced from said end electrodes and spaced from each other; and a suitable impedance connecting said end electrodes; whereby the change in sensitivity of the detector with the position of the beam in the said block can be made small.

The block of semi conductor material is typically bar shaped with the opposite faces substantially parallel end faces of the bar. The bar may be conveniently of circular cross section.

The electrodes are preferably ring electrodes, each making contact with the block at substantially every point along the inside of an electrode, and each lying in a plane substantially parallel with the planes of the opposite faces.

The semi conductor material is preferably P-doped to a resestivity of about 30 ohm cm, and the semi conductor may be germanium.

The impedance connecting the end electrodes is preferably preadjustable and may be a resistor typically in the resistance range from about 100 ohm to about 400 ohm.

The invention extends to a laser power measuring means having a detector as aforesaid and voltage measuring means connected between any two of the intermediate electrodes whereby the power of a laser beam passing through both opposite faces may be indicated.

The invention also extends to a laser system having a laser and coacting power measuring means as aforesaid.

The invention will be further described, by way of example only, with reference to the accompanying drawings in which FIG. 1 is a diagrammatic illustration of the invention co-acting with a laser and its load.

Figure 1:
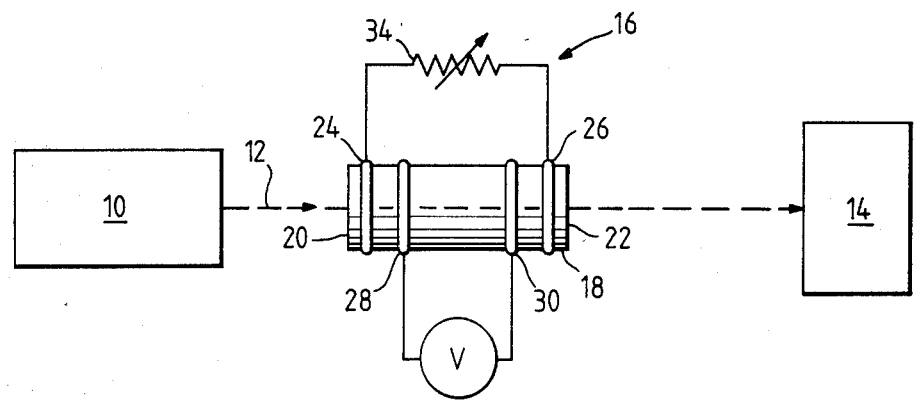
Figure 2:
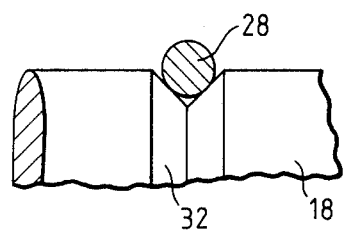
FIG. 2 illustrates an arrangement for the attaching of an electrode.

Referring to FIG. 1, 10 indicates a laser of the carbon dioxide ($CO_2$) kind which can generate a beam 12 in the direction of the arrow heads at a wavelength of 10.6 micro meter. The beam is directed to a target or load 14. In the path of the beam 12 is arranged a photon drag detector indicated generally by 16. The photon drag detector comprises a cylinder 18 of germanium; the cylinder has two opposite end faces 20, 22, parallel to one another and normal to the axis of the cylinder. In contact with the cylinder 18 are ring electrodes 24, 26, 28, 30. The electrodes 24 and 26 are end electrodes and 28 and 30 are intermediate electrodes. Each electrode (FIG. 2) is arranged in a groove 32 circumferential to the cylinder 18.

The inside of the ring electrode makes good electrical contact with the cylinder round the whole circumference. Between the end electrodes 24, 26 is connected a resistor 34 which is preferably of the pre-set kind, facilitating initial adjustment of the photon drag detector.

The cylinder 18 is, in one example, 20 mm in length and 12.5 mm in diameter, and is made of germanium P-doped to a resistivity of 30 ohm cm. The electrodes are made of tinned copper wire having a diameter of about 1.2 mm; the end electrodes 24, 26 being arranged about 1.5 mm from the respective faces 20 and 22, while the intermediate electrodes 28, 30 are arranged each about 4 mm from the near end electrode. The contact between electrode and cylinder may be made by a number of means, two of which are indium pressing and conducting epoxy resin cement. The resistor 34 has a resistance which may be set in the range from about 100 ohm to 400 ohm. The foregoing dimensions are typical only and not critical.

In use the beam 12 is made to pass through the cylinder 18 parallel with the axis of the cylinder. It is then found that a small voltage appears across the intermediate electrodes 28, 30. This voltage may be measured conveniently by means of a cathode ray oscilloscope, being typically of the order of millivolts. The relation of the voltage to the beam power may be determined from knowledge of the power input to the laser 10; and also from direct energy measurements if the load 14 is arranged to be a suitable form of calorimeter.

Figure 3:
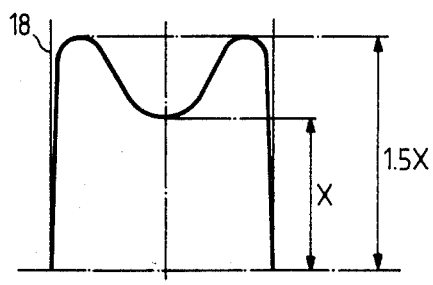
FIG. 3 and FIG. 4 are profiles of voltage signal in relation to laser beam position in a detector.

In order to measure the whole power transmitted by the beam 12 it is necessary to arrange that the cross section of the cylinder 18 is appreciably greater than the cross section of the beam. If the beam 12 is gradually displaced from an axial position towards the circumferential boundary of the cylinder it is found that in a conventional photon drag detector, having only the two end electrodes 24 and 26, the voltage developed between these electrodes for a constant average beam power, varies approximately according to the profile shown in FIG. 3. The voltage may vary from a value X (say) on the axis to a peak of 1.5 X near the circumference. The figure 1.5 is not of universal application but can typically vary between 1.3 and 1.6 as between one detector and another.

Figure 4:
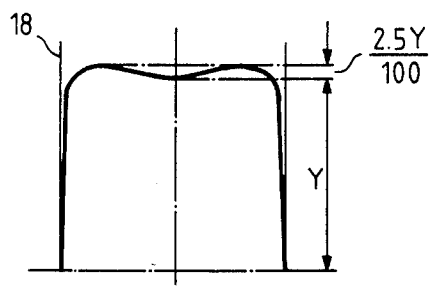

In the present invention, as described above, the voltage is measured between intermediate electrodes 28, 30, when it is found that the variation of voltage with the location of beam 12 in relation to the axis of cylinder 18 is very materially reduced. Initial adjustment of the resistance 34 can reduce the variation to a minimal value. This is illustrated diagrammatically in FIG. 4.

If Y is the measured voltage between electrodes 28 and 30 with the beam 12 on the cylinder axis, then the variation from that value with location of the beam can typically be reduced to 2.5 Y/100.

As exemplified above, the invention employs a cylinder 18 made of germanium, P-doped. It is possible to employ other semi conductors than germanium, for example silicon and indium antimonide. It is also possible to use a semi conductor which is N-doped.

The use of the invention for measurements on a $CO_2$ laser has been mentioned. It is possible to use the invention with other infra red lasers, for example the carbon monoxide (CO) laser, operating at a wavelength of 5.3 micrometer. In principle, a photon drag detector according to the invention may be used for measurements at other than infra red wavelengths, provided, of course, that the semi conductor employed is substantially transparent to the wavelength concerned.

We claim:

1. A photon drag detector comprising:
   a bar shaped block of semiconductor material with two opposite faces through one of which a beam of radiation enters and from the other of which it emerges;
   spaced end electrodes in contact with said block, one adjacent to each of said opposite faces;
   at least two intermediate electrodes in contact with said block, arranged intermediate and spaced from said end electrodes and spaced from each other; and
   a suitable impedance connecting said end electrodes;
   whereby a change in sensitivity of the detector, with the position of the beam in the said block as measured by a voltage developed between the intermediate electrodes, is made small compared with a detector not provided with said impedance.

2. A detector according to claim 1 in which the said opposite faces are substantially parallel end faces of the bar shaped block.

3. A detector according to claim 2 in which the block has a substantially circular cross section.

4. A detector according to claim 3 in which each electrode is a ring electrode, encircling the bar and making contact therewith uniformly around its circumference, and the plane of the electrode being substantially parallel with the planes of the opposite faces.

5. A detector according to claim 1 in which the semiconductor material comprises material doped to a resistivity of about 30 ohm centimeter.

6. A detector according to claim 5 in which the semiconductor material comprises p-doped material.

7. A detector according to claim 1 in which the semiconductor material comprises germanium.

8. A detector according to claim 1 comprising only two intermediate electrodes.

9. A detector according to claim 1 in which the impedance connecting the end electrodes is variable.

10. A detector according to claim 9 in which the impedance is a resistor in the range from about 100 ohm to about 400 ohm.

11. A detector according to claim 1 further comprising voltage measuring means connected between the intermediate electrodes; whereby the power of a laser beam passing through both opposite faces is indicated.

12. A laser system comprising:
    a laser; and
    a coacting power measuring means including a bar shaped block of semiconductor material with two opposite faces through one of which a beam of radiation enters and from the other of which it emerges;
    spaced end electrodes in contact with said block, one adjacent to each of said opposite faces;
    at least two intermediate electrodes in contact with said block, arranged intermediate and spaced from said end electrodes and spaced from each other;
    a suitable impedance connecting said end electrodes;
    whereby a change in sensitivity of the detector, with the position of the beam in the said block as measured by a voltage developed between the intermediate electrodes, is made small compared with a detector not provided with said impedance; and
    voltage measuring means connected between the intermediate electrodes; whereby the power of a laser beam passing through both opposite faces is indicated.

* * * * *